United States Patent
Wong et al.

[11] Patent Number: 6,137,313
[45] Date of Patent: Oct. 24, 2000

[54] RESISTIVE PULL-UP DEVICE FOR I/O PIN

[75] Inventors: Wilson Wong, San Francisco; Thomas H. White, Santa Clara, both of Calif.

[73] Assignee: Altera Corporation, San Jose, Calif.

[21] Appl. No.: 09/080,539

[22] Filed: May 18, 1998

Related U.S. Application Data

[60] Provisional application No. 60/050,381, Jun. 20, 1997.

[51] Int. Cl.[7] ............................................. H03K 19/0175
[52] U.S. Cl. ................................................. 326/83; 326/86
[58] Field of Search ................................. 326/57, 82, 83, 326/112, 119, 121, 30, 86

[56]  References Cited

U.S. PATENT DOCUMENTS

| | | | |
|---|---|---|---|
| 4,789,917 | 12/1988 | Miller | 361/56 |
| 4,901,280 | 2/1990 | Patel | 365/189.11 |
| 4,931,673 | 6/1990 | Naghshineh | 307/475 |
| 5,073,726 | 12/1991 | Kato et al. | 307/443 |
| 5,150,186 | 9/1992 | Pinney et al. | 357/42 |
| 5,216,292 | 6/1993 | Imazu et al. | 307/443 |
| 5,237,221 | 8/1993 | Posse | 307/468 |
| 5,408,145 | 4/1995 | Nguyen | 326/121 |
| 5,500,611 | 3/1996 | Popat et al. | 326/87 |
| 5,570,043 | 10/1996 | Churchill | 326/81 |
| 5,574,389 | 11/1996 | Chu | 326/81 |
| 5,886,549 | 3/1999 | Naura | 327/143 |
| 5,933,027 | 8/1999 | Morris et al. | 326/81 |

*Primary Examiner*—Michael Tokar
*Assistant Examiner*—Anh Tran
*Attorney, Agent, or Firm*—Townsend and Townsend and Crew LLP

[57] ABSTRACT

Various embodiments for improved I/O pin pull-up circuitry are disclosed. The pull-up devices according to the present invention minimize dissipation of crowbar current when the I/O pin is tri-stated. Circuit techniques are disclosed for minimizing the crowbar current as well as making the circuit high voltage tolerant.

10 Claims, 2 Drawing Sheets

RESISTIVE PULL-UP DEVICE FOR I/O PIN

This application claims the benefit of priority from Provisional Patent Application Ser. No. 60/050,381, filed Jun. 20, 1997, which is hereby incorporated by reference in its entirety.

BACKGROUND OF THE INVENTION

The present invention relates in general to integrated circuits, and in particular to various embodiments for a resistive pull-up device on an integrated circuit input/output (I/O) terminal.

An I/O pin of an integrated circuit may be connected to an external bus that is tri-statable. Under the tri-state condition, the voltage level at such an I/O pin may be floating at levels that may cause excessive current dissipation by the I/O circuitry inside the integrated circuit. Thus, in certain applications, I/O pins in an integrated circuit are required to have a built-in resistive pull-up or pull-down device to avoid the high-current tri-state conditions. Resistive pull-up or pull-down devices are also used as programmable resistors in open drain (or open collector) applications where wired OR logic is implemented.

A common prior art approach to implementing a built-in pull-up device has been to add a diode-connected n-channel transistor that connects the I/O pin to the positive power supply rail Vcc. An example of this prior art approach is shown in FIG. 1. When the external node is tri-stated, n-channel transistor 100 pulls the I/O node up to Vcc-Vtn, where Vtn is the threshold voltage of the n-channel transistor. Transistor 100 is designed to be weak enough and easily over-driven by internal or external logic. One advantage of using an n-channel transistor is that when the pin voltage goes above Vcc, the diode-connected n-channel transistor turns off and ensures that no current flows back into the power supply line. There is a drawback, however, in that the circuit of FIG. 1 might still cause appreciable amounts of standby (DC) current Icc to be dissipated when the pin is tri-stated.

When the pin is tri-stated, diode-connected n-channel transistor 100 pulls this node up but not all the way to Vcc. As mentioned earlier, the pin voltage is pulled up to Vcc-Vtn, where Vtn is the threshold voltage of n-channel transistor 100. It is very common for the I/O pin to drive a TTL input buffer 102 inside the integrated circuit as shown in FIG. 1. A TTL buffer typically includes an inverter with the sizes of p-channel transistor 104 and n-channel transistor 106 adjusted to have a trip point at about 1.4 volts. One function of the pull-up device is to ensure that the input buffer is in a known state when external or internal drivers aren't driving the I/O pin. In the case of the circuit of the FIG. 1, the pull-up transistor is intended to operate to turn off p-channel transistor 104 and turn on n-channel transistor 106 for a logic low at the output of buffer 102. However, if the threshold voltage Vtn of n-channel pull-up transistor 100 is greater than the absolute magnitude of the threshold voltage |Vtp| of p-channel transistor 104, p-channel transistor 104 would have a source-to-gate voltage larger than its threshold voltage, and would thus be slightly turned on and conductive. This problem is exacerbated by the fact that the threshold voltage Vtn for n-channel transistor 100 may be increased by body effect. With Vcc-Vtn at its gate terminal, p-channel transistor 104 is turned on even harder during the switching on of n-channel transistor 106 due to body effect. The resulting crowbar current can be in the tens of microamps, which can be significant in lower power integrated circuits.

There is therefore a need for an improved pull-up device for I/O pins, that minimizes current dissipation by the circuit.

SUMMARY OF THE INVENTION

The present invention provides various embodiments for improved I/O pin pull-up circuitry that dissipate almost no current when the I/O pin is tri-stated. In one embodiment, the present invention utilizes either an n-channel transistor with a lower threshold voltage (e.g., a native transistor) or a p-channel transistor to perform the pull-up function. In another embodiment, the present invention places pull-up transistors inside a separately biased well to ensure not only the elimination of the crowbar current but to enable the circuit to withstand pin voltages higher than Vcc.

Accordingly, in one embodiment, the present invention provides an integrated circuit including an I/O terminal adapted to couple to circuitry outside the integrated circuit; an I/O circuit coupled to the I/O terminal; and an n-channel pull-up transistor having a gate terminal, a first current-carrying terminal coupled to a power supply terminal, and a second current-carrying terminal coupled to the I/O terminal, wherein, the n-channel pull-up transistor has a threshold voltage that is lower than an absolute magnitude of the threshold voltage for a p-channel transistor.

In another embodiment, the present invention provides an integrated circuit including an I/O terminal adapted to couple to circuitry outside the integrated circuit; an I/O circuit coupled to the I/O terminal; and a p-channel pull-up transistor having a gate terminal, a first current-carrying terminal coupled to a power supply terminal, and a second current-carrying terminal coupled to the I/O terminal, wherein, the p-channel pull-up transistor is a substantially weak transistor that comprises a small channel to minimize its on current.

In yet another embodiment, the present invention provides a circuit formed in a semiconductor substrate including an I/O terminal, an I/O circuit coupled to the I/O terminal, and a pull-up circuit coupled to the I/O terminal, wherein the pull-up circuit includes a pull-up transistor formed in a well region inside the substrate, and a switching bias circuit configured to bias the well region to either a supply voltage or the voltage applied to the I/O terminal. In a more specific embodiment, the pull-up circuit further includes a second transistor formed in a well region and coupled in series with the pull-up transistor.

A better understanding of the nature and advantages of the pull-up circuitry of the present invention may be had with reference to the detailed description and the drawings below.

DESCRIPTION OF THE PREFERRED EMBODIMENT

Referring back to FIG. 1, the undesirable crowbar current through input buffer 102 occurs as a result of p-channel transistor 104 not being completely turned off by the pull-up device. To eliminate this crowbar current, the present invention ensures that the voltage at the I/O pin is pulled closer to, or all the way up to the Vcc level. An I/O usually refers to a pin or terminal that is both an input and an output. The teachings of the present invention, however, are not limited to a pin that is both an input and an output, and the improved pull-up circuit can be used for input only or output only terminals as well. Thus, the terminology "I/O pin" or "I/O terminal" as used interchangeably herein refer to a bonding pad on an integrated circuit (or the corresponding pin on the integrated circuit package) that is either an input terminal, or an output terminal, or both.

Figure 1:
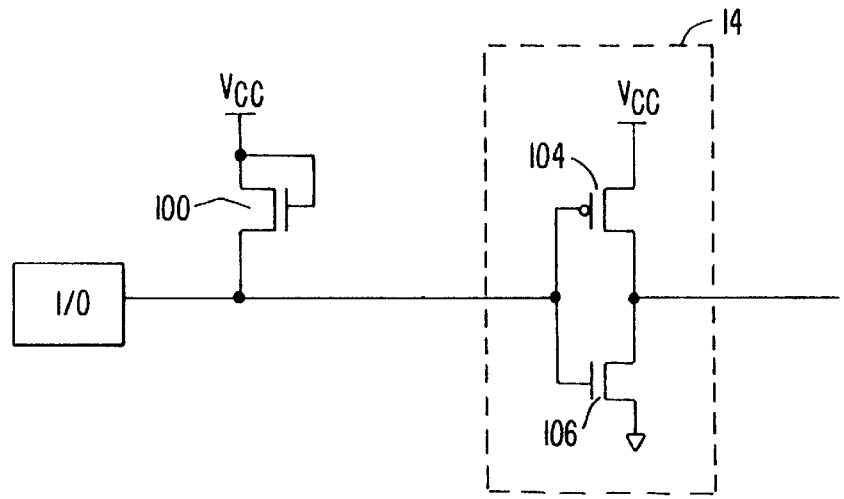
FIG. 1 shows a typical prior art I/O pull-up circuit.
Figure 2A:
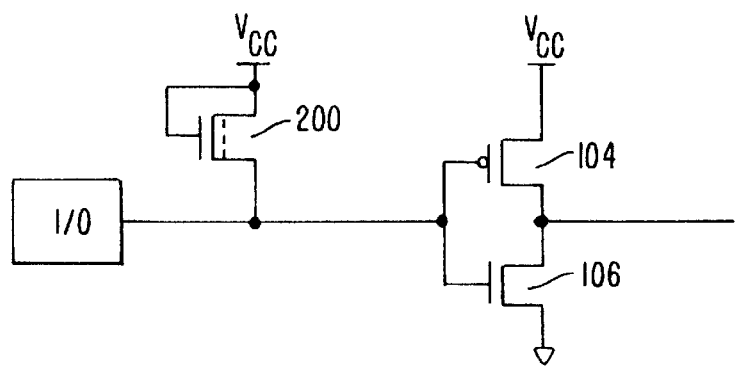
FIGS. 2A and 2B show embodiments of the present invention that use a low Vt or native n-channel transistor as the I/O pin pull-up device.

In one embodiment shown in FIG. 2A, the present invention uses a diode-connected n-channel transistor 200 with a lower threshold voltage (e.g., a native transistor) in place of the normal Vt-enhanced n-channel pull-up 100 in FIG. 1. Normally, a conventional CMOS process includes transistor threshold implant steps to adjust the threshold voltages of the n-channel and p-channel transistors. The process may provide for a specialized low-Vt n-channel transistor, or native transistor that does not receive the threshold adjusting implantation of impurities. The low-Vt or native n-channel transistor would have a lower threshold voltage as compared to the threshold voltage of a normal n-channel transistors. With a reduced threshold voltage Vtn, diode connected n-channel transistor 200 pulls the voltage on the I/O pin much closer to Vcc when the pin is tri-stated. With a voltage much closer to Vcc at its gate terminal and Vcc at its source terminal, p-channel transistor 104 will be turned off and at worst may contribute a small leakage current in the range of nano amperes. Transistor 200 is designed to be weak and easily overpowered when the I/O pin is to be driven. This can be accomplished by making the channel size (width to length W/L ratio) of transistor 200 small.

Figure 2B:
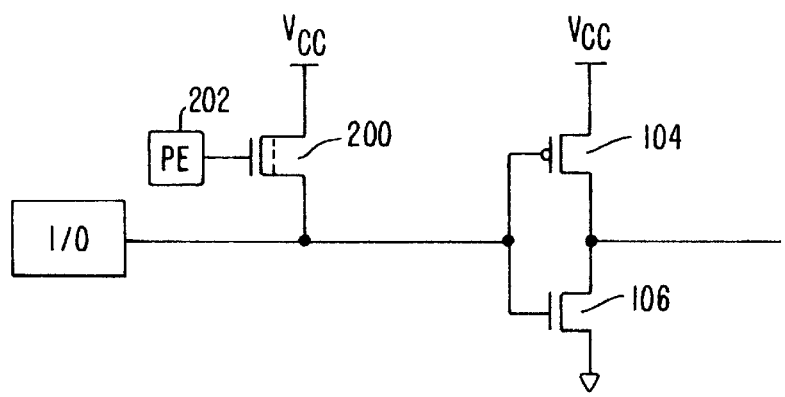

In some applications, the pull-up function may be provided externally (i.e., on the circuit board where the integrated circuit chip resides), and thus may not be required inside the chip. To make the integrated circuit compatible with these types of applications, in an alternate embodiment, instead of diode-connecting low-Vt n-channel transistor 200, the present invention connects the gate terminal of transistor 200 to a programmable node 202. This embodiment is shown in FIG. 2B. Thus, when a built-in pull-up function is not required, node 202 is programmed to a logic low voltage to turn off transistor 200. When a built-in pull-up function is required, node 202 is programmed to a logic high voltage. Various programming means such as volatile and nonvolatile memory technology as well as fusible links and layout mask programming and the like can be used to program node 202.

Figure 3A:
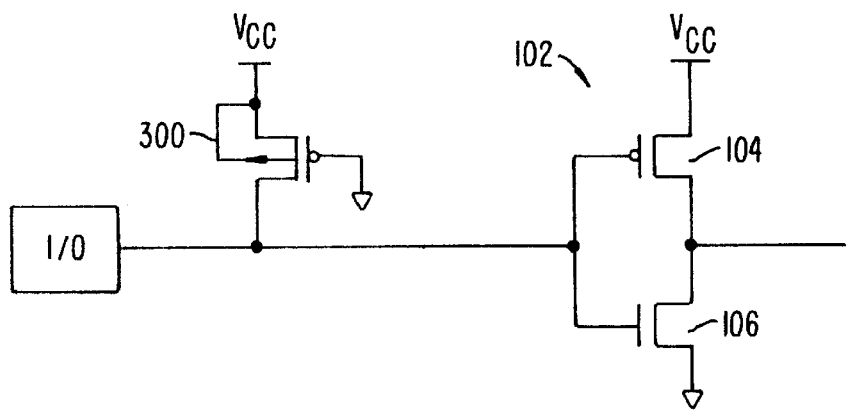
FIGS. 3A and 3B show embodiments of the present invention that use a diode-connected p-channel transistor as the I/O pin pull-up device.
Figure 3B:
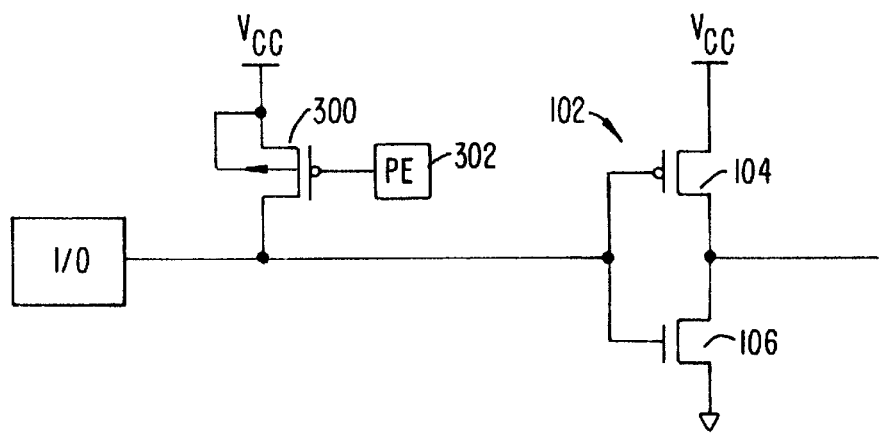

The embodiments shown in FIGS. 2A and 2B do address the excessive crowbar current problem, but are limited to those CMOS processes that provide for the specialized low-Vt or native transistor. Most conventional CMOS processes do not provide for such transistors. For these processes, the present invention offers the use of a p-channel pull-up transistor 300 as shown in FIG. 3A. P-channel transistor 300 has its gate terminal connected to ground and is thus turned on pulling the I/O pin up to Vcc without a threshold voltage drop. Here also, transistor 300 is weak (i.e., small W/L ratio) and easily overpowered when the I/O pin is not tri-stated. With the pin voltage at full Vcc (in tri-state mode), the crowbar current in TTL buffer 102 is completely eliminated. FIG. 3B illustrates a programmable version of the same embodiment wherein the gate terminal of p-channel pull-up transistor 303 is connected to a programmable element 302 much like the embodiment shown in FIG. 2B.

While the embodiments shown in FIGS. 3A and 3B eliminate the undesirable crowbar current, they are limited in terms of acceptable voltage range at the I/O pin. There are electronic applications wherein a chip that is powered by, for example, a 3 volt supply voltage is required to receive and process 5 volt signals. In such circumstance when the voltage at the I/O pin exceeds Vcc, the circuit of FIGS. 3A and 3B may cause current to flow from the I/O pin into the power supply terminal. This reversal of the current flow into the Vcc node is undesirable as it may increase the power supply voltage Vcc and cause voltage stress on internal circuitry. Current flow into the Vcc node can occur in one of two conditions. When the voltage at the I/O pin exceed Vcc+|Vtp|, the direction of current conduction through the on channel of transistor 300 is from the pin to Vcc. The other condition under which current may flow into Vcc, is when the voltage at the I/O pin exceeds Vcc+Vdiode, where Vdiode is the diode turn-on voltage of the PN junction from the p⁺ source/drain region to the n-well region of the p-channel transistor. In a typical n-well CMOS process, a p-channel transistor resides inside an n-well region that forms the body of the transistor. To ensure that the p+source/drain to n-well junctions are not forward biased in normal operation of the transistor, the n-well region (or body terminal) of p-channel transistors are typically tied to the most positive potential (i.e., Vcc) on the chip. This is schematically shown in FIGS. 3A and 3B by body terminal 304 connecting to Vcc. Thus, when the voltage at the I/O pin exceeds Vcc+Vdiode, this junction is forward biased and current flows from the pin into the Vcc node.

Figure 4:
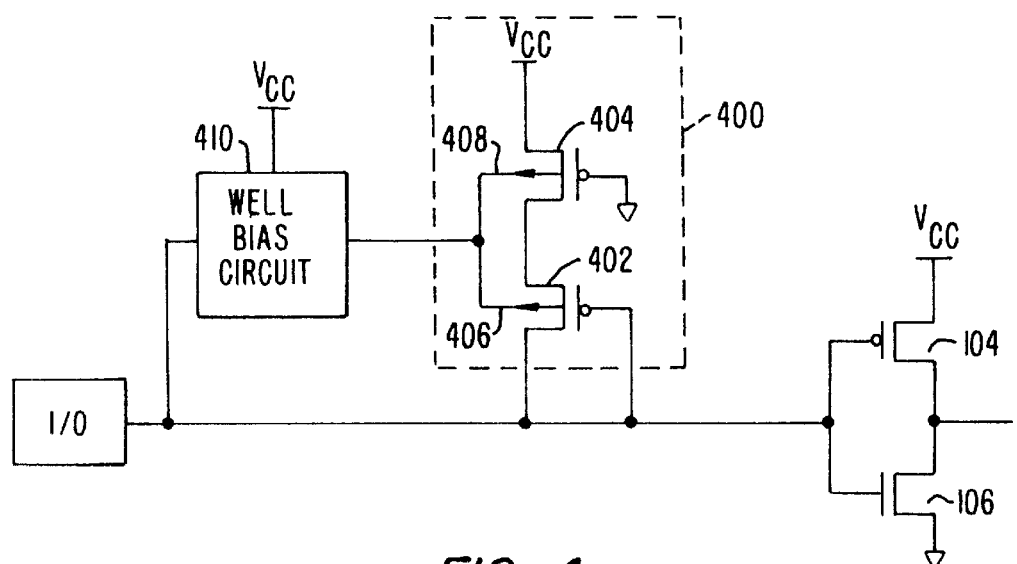
FIG. 4 is a circuit diagram of another embodiment of the present invention where the pull-up circuit includes two series connected p-channel transistors with switched n-wells.

In another embodiment of the present invention, a pull-up circuit is provided that is tolerant to I/O voltages higher than Vcc and that doesn't require a low-Vt or native implant mask. Referring to FIG. 4, there is shown a pull-up circuit 400 that includes a diode-connected p-channel pull-up transistor 402 and a weak p-channel pull-up transistor 404 serially connected between the I/O terminal and Vcc. Instead of connecting to Vcc, the n-wells or body terminals 406 and 408 of p-channel transistors 402 and 404 connect to a well biasing circuit 410. Well bias circuit 410 detects the voltage level at the I/O terminal and switches body terminals 406 and 408 of the p-channel transistors to the higher of Vcc or the I/O pin voltage. Preferred embodiments for well bias circuit 410 are described in detail in commonly-assigned provisional patent application Ser. Nos. 60/018,465, 60/018,494, 60/018,510 and 60/031,617, all hereby incorporated by reference in their entirety for all purposes.

The circuit of FIG. 4 eliminates both conditions under which current may flow from the I/O pin to Vcc. Diode-connected p-channel transistor 402 ensures that a conductive channel will not form in the direction from the I/O pin to Vcc when the voltage at the I/O pin exceeds Vcc+|Vtp|. By switching the voltage at n-well terminals 406 and 408 to the higher of Vcc or the I/O pin voltage, the inherent PN junction diodes will remain reverse biased and thus no current flows into Vcc via these diodes. An alternate embodiment, however, may include only one p-channel pull-up transistor with a switchable well bias.

The insertion of diode-connected p-channel transistor 402 introduces a Vtp drop between Vcc and the I/O pin. However, care is taken in the design and sizing of the devices to minimize the potential crowbar current. In a preferred embodiment, the channel width (W) and length (L) of p-channel transistors 402 and 104 are designed such that the threshold voltage Vtp(402) of transistor 402 is smaller than Vtp(104) of transistor 104 in buffer 102. This can be accomplished by designing transistor 402 with a channel width W(402) that is equal to or larger than the channel width W(104) of transistor 104, while the channel length L(404) of transistor 404 is made smaller than the channel length L(104) of transistor 104. Aided by a phenomenon called the short channel effect, the smaller channel length of transistor 402 ensures that Vtp(402) is smaller than Vtp (104). This in turn ensures that p-channel transistor 104 is not turned on when the I/O pin is tri-stated and pulled up to (near) Vcc by transistors 402 and 404.

An advantage of having two serially connected pull-up transistors 402 and 404 is that it allows for easier fine tuning of the pull-up current. As discussed above, the sizing of the channel for transistor 402 is governed by the threshold concerns in order to minimize crowbar current. Transistor 404, however, is not constrained by this concern and its channel size can be adjusted to obtain a desired pull-up current of for example 60 micro amperes. It should also be noted that FIG. 4 depicts the gate terminal of p-channel transistor 404 being connected to ground. As in the embodiments shown in FIGS. 2B and 3B, in an alternate embodiment, the gate terminal of transistor 404 connects to a programmable node. This allows for programmably disconnecting the pull-up circuit if desired (i.e., when an external pull-up means is provided).

In conclusion, the present invention provides various embodiments for improved I/O pin resistive pull-up circuitry that dissipate no current when the I/O pin is tri-stated. In one embodiment, the present invention utilizes either a native n-channel transistor with a lower threshold voltage or a p-channel transistor to perform the pull-up function. In another embodiment, the present invention places pull-up transistors inside a separately biased well to ensure not only the elimination of the crowbar current but to enable the circuit to withstand pin voltages higher than Vcc. While the above is a complete description of specific embodiments of the present invention, it is possible to use various alternatives, modifications and equivalents. For example, a TTL input buffer in the form of a CMOS inverter has been used as an exemplary I/O circuit connecting to I/O terminal. The advantages of the pull-up circuit of the present invention can be realized with other types of I/O circuitry that present similar circuit considerations. Therefore, the scope of the present invention should be determined not with reference to the above description but should, instead, be determined with reference to the appended claims, along with their full scope of equivalents.

What is claimed is:

1. A circuit formed in a semiconductor substrate comprising:
   an I/O terminal;
   an I/O circuit coupled to the I/O terminal; and
   a pull-up circuit coupled to the I/O terminal, the pull-up circuit including:
      a pull-up transistor formed in a well region inside the substrate;
      a second transistor formed in the well region coupling in series with the pull-up transistor; and
      a switching bias circuit configured to bias the well region to either a supply voltage or the voltage applied to the I/O terminal;
   wherein the gate terminal of the pull-up transistor is coupled to ground; and
   wherein the gate terminal of the second transistor is coupled to the I/O terminal.

2. The circuit of claim 1 wherein the pull-up transistor and the second transistor are p-channel transistors formed in n-type well regions.

3. The circuit of claim 2 wherein the gate terminal of the pull-up transistor couples to ground.

4. The circuit of claim 1 wherein the switching bias circuit is configured to bias the well region of the second transistor to either the supply voltage or the voltage applied to the I/O terminal.

5. The circuit of claim 4 wherein the pull-up transistor and the second transistor are formed inside the same n-type well region.

6. The circuit of claim 5 wherein the switching bias circuit is configured to bias the n-type well region to the higher of the power supply voltage or the voltage on the I/O terminal.

7. The circuit of claim 2 wherein the second transistor is diode-connected and is a substantially weak transistor comprising a channel that is longer than the minimum channel length to minimize its ON current.

8. The circuit of claim 7 wherein the I/O circuit comprises an input p-channel transistor having a gate terminal coupled to the I/O terminal and a current-carrying terminal coupled to the power supply terminal.

9. The circuit of claim 8 wherein a channel length of the pull-up transistor is substantially smaller than a channel length of the input p-channel transistor.

10. The integrated circuit of claim 7 wherein a width of the pull-up transistor is equal to or larger than a width of the input p-channel transistor.

* * * * *